(12) United States Patent
Mason et al.

(10) Patent No.: US 12,276,678 B2
(45) Date of Patent: Apr. 15, 2025

(54) ELECTRICAL WIRE MANAGEMENT TOOL

(71) Applicant: MECHANICAL DYNAMIX SOLUTIONS LLC, Long Beach, CA (US)

(72) Inventors: John Mason, Long Beach, CA (US); Rodney Daniels, Long Beach, CA (US)

(73) Assignee: MECHANICAL DYNAMIX SOLUTIONS LLC, Long Beach, CA (US)

( * ) Notice: Subject to any disclaimer, the term of this patent is extended or adjusted under 35 U.S.C. 154(b) by 212 days.

(21) Appl. No.: 18/123,864

(22) Filed: Mar. 20, 2023

(65) Prior Publication Data
US 2023/0400479 A1 Dec. 14, 2023

(51) Int. Cl.
*G01R 1/067* (2006.01)
*G01R 19/15* (2006.01)

(52) U.S. Cl.
CPC ......... *G01R 1/06788* (2013.01); *G01R 19/15* (2013.01)

(58) Field of Classification Search
CPC ....... G01R 1/06788; G01R 19/15; H02G 1/00
USPC ....................................... 324/126, 76.11, 500
See application file for complete search history.

(56) References Cited

U.S. PATENT DOCUMENTS

| | | | |
|---|---|---|---|
| 9,116,178 B1* | 8/2015 | Czarnecki | G01R 19/145 |
| 2002/0057089 A1* | 5/2002 | Brown | G01R 31/67 |
| | | | 324/508 |
| 2016/0327599 A1* | 11/2016 | Wiesemann | G01R 19/155 |

* cited by examiner

*Primary Examiner* — Giovanni Astacio-Oquendo
(74) *Attorney, Agent, or Firm* — ONE LLP (57) ABSTRACT

An electrical wire management device. The device generally includes a handle, a wand coupled to an end of the handle, and a cradle coupled to the distal end of the wand. The wand comprising a cylindrical shaft having a proximal end and a distal end. The cradle includes a body coupling a first prong and a second prong to each other so as to form a substantially U-shape. The body and the first and second prongs define a yoke for receiving an electrical wire therethrough. The cradle is configured to manage and manipulate electrical wiring in an electrical box or wiring harness.

15 Claims, 7 Drawing Sheets

ELECTRICAL WIRE MANAGEMENT TOOL

CROSS-REFERENCE TO RELATED APPLICATIONS

The present application is a continuation-in-part of U.S. patent application Ser. No. 17/950,363, filed Sep. 22, 2022, which claims priority to and the benefit of U.S. Provisional Patent Application No. 63/246,868, filed Sep. 22, 2021, both of which are incorporated by reference herein in their entireties for all purposes.

TECHNICAL FIELD

The present disclosure generally relates to an electrical wire tool, and more specifically, to a tool for assembling and bending electrical wiring.

BACKGROUND

Handling "hot" or "live" electrical wiring can be very dangerous and complicated for electrical technicians. First, it is not easy to ascertain whenever a wire is live by observation with the naked eye. Often times, a technician does not know whether an electrical wire is live until they physically touch the wire. If the wire is carrying high voltage, this could be a costly mistake for the technician, resulting in electrocution and/or permanent physical injury to the technician.

Second, physically handling electrical wiring can be difficult, especially when a wiring harness comprises many wires. As the technician attempts to bend or otherwise arrange the wiring, the technician may accidentally touch a live wire or unintentionally bend an adjacent wire. In either case, this leads to an undesirable result.

A need, therefore, exists for a tool that enables technicians to identify live wires, while at the same time allowing them to bend, handle, and manage electrical wiring safely.

SUMMARY

The present disclosure is directed to an electrical wire management device. The device generally includes a handle, a wand coupled to an end of the handle, and a cradle coupled to the distal end of the wand. The wand comprises a cylindrical shaft having a proximal end and a distal end. The cradle includes a body coupling a first prong and a second prong to each other so as to form a substantially U-shape. The body and the first and second prongs define a yoke for receiving an electrical wire therethrough. The cradle is configured to manage and manipulate electrical wiring in an electrical box or wiring harness.

In some implementations, the handle may comprise an elongated member having a gripping surface.

In other implementations, the wand is detachably coupled to the handle by a quick locking-and-release mechanism.

In other implementations, the first prong and the second prong each comprise an elongated cylindrical shape.

In other implementations, the body of the cradle is defined by opposing planar surfaces.

In other implementations, the cradle and the wand are made of non-conductive material.

In other implementations, the yoke is configured to cradle the electrical wire wherein the user may grip and turn the handle clockwise or counterclockwise to bend or otherwise manipulate the electrical wire extending through the yoke.

The present disclosure is further directed to an electrical wire management device having a handle enclosing a battery, a wand coupled to an end of the handle, and a cradle coupled to the distal end of the shaft. The wand comprises a cylindrical shaft having a proximal end and a distal end. The shaft encloses a transistor circuit, where the transistor circuit is electrically coupled to the battery. The cradle includes a body coupling a first prong and a second prong to each other so as to form a substantially U-shape. The body and the first and second prongs define a yoke for receiving an electrical wire therethrough. The first prong and second prong include induction sensors electrically coupled to the transistor circuit.

In some implementations, the transistor circuit is configured to detect a live current flowing through an electrical wire when the wand is placed in proximity to the electrical wire.

In other implementations, the transistor circuit detects a live current flowing through an electrical wire by electromagnetic induction.

In other implementations, the cradle houses a light-emitting diode electrically coupled to the transistor circuit, wherein when the transistor circuit detects a live electrical current flowing the electrical wire, the transistor circuit energizes the light-emitting diode to indicate that the electrical wire is "hot."

In other implementations, the cradle houses a transducer electrically coupled to the transistor circuit, wherein when the transistor circuit detects a live electrical current flowing the electrical wire, the transistor circuit energizes the transducer to cause the transducer to emit an audio sound to indicate that the electrical wire is "hot."

In other implementations, the wand is detachably coupled to the handle by a quick locking-and-release mechanism.

In other implementations, the cradle and the wand are made of non-conductive material.

In other implementations, the yoke is configured to cradle the electrical wire wherein the user may grip and turn the handle clockwise or counterclockwise to bend or otherwise manipulate the electrical wire extending through the yoke.

The disclosure herein is a summary of the invention and not an extensive overview of all contemplated embodiments. It should be appreciated that many other features, applications, embodiments, implementations and/or variations of the disclosed technology will be apparent from the accompanying drawings and from the following detailed description. While multiple implementations are disclosed, the drawings and detailed description are to be regarded as illustrative in nature and not restrictive.

BRIEF DESCRIPTION OF THE DRAWINGS

This disclosure may be better understood by referring to the following figures. The components in the figures are not necessarily to scale, emphasis instead being placed upon illustrating the principles of the disclosure. In the figures, the reference numerals designate corresponding parts throughout the different views.

DETAILED DESCRIPTION

FIGS. 1-6 illustrate examples of various implementations of an electrical wire management device. As described herein, the device includes a handle, a wand coupled to a first end of the handle, and a yoke-shaped cradle coupled to an opposite end of the wand. The cradle includes a coupling portion that couples a first prong and a second prong to each other so as to form a substantially U-shape. The coupling portion and the first and second prongs define a cradle for receiving an electrical wire therethrough. The cradle is configured to assemble and bend electrical wiring in a wiring harness.

Figure 1:
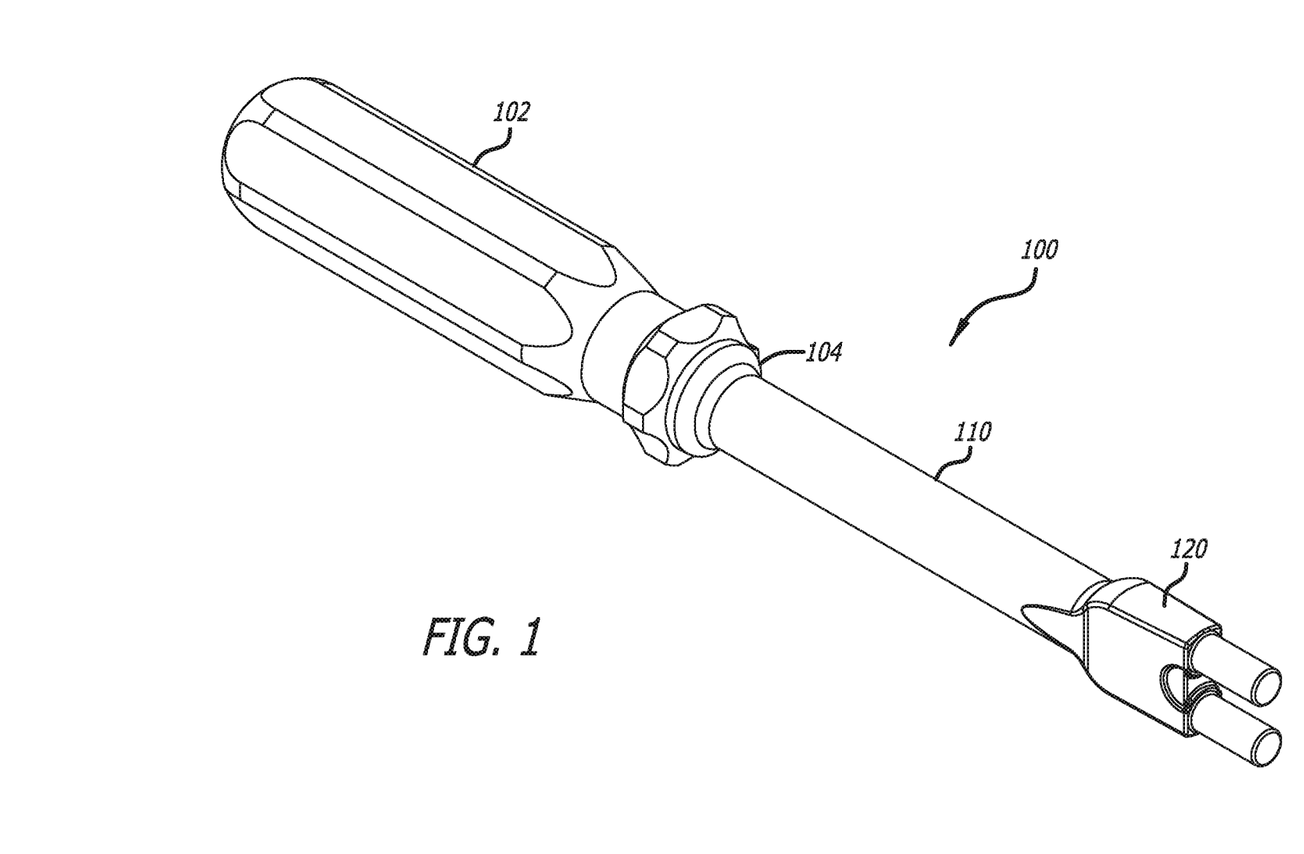
FIG. 1 is a front perspective view illustrating one example of an electrical wire management device according to the teachings of the present disclosure.

FIG. 1 is a front perspective view of one example of an electrical wire management device 100 according to the teachings of the present disclosure. As shown, the device 100 includes a handle 102, a wand 110 coupled to a first end 104 of the handle 102, and a yoke-shaped cradle 120 coupled to a distal end of the wand. The various components of the device may be made of plastic, porcelain, graphite, ceramic, thermoplastics, polyvinyl chloride (PVC), or any other non-conductive and/or electrically insulative material.

Figure 2:
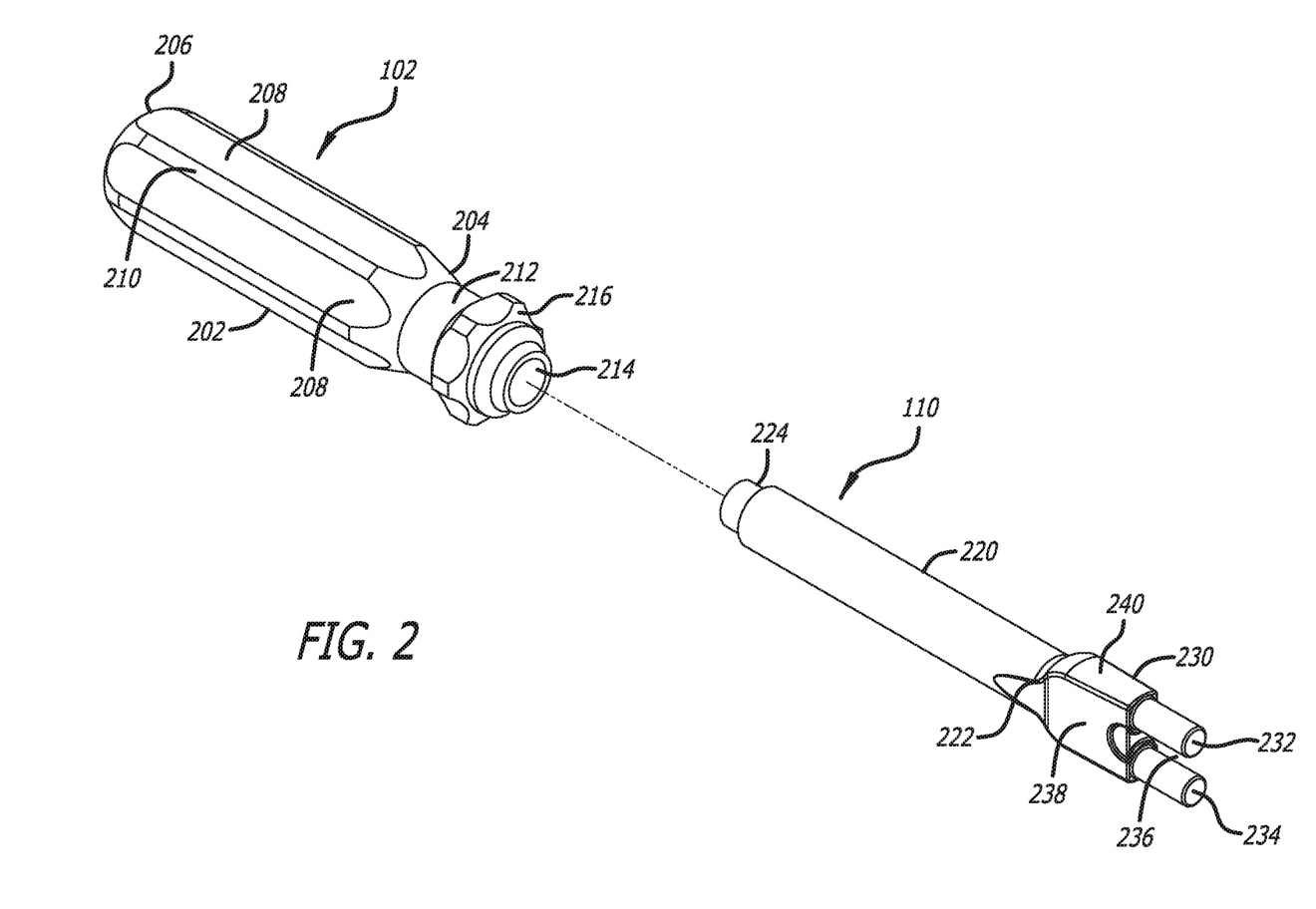
FIG. 2 is an assembly view of the electrical wire management device of FIG. 1.

FIG. 2 an assembly view of the electrical wire management device 100. As shown, the handle 102 may comprise a cylindrical shaped elongated member 202 having a first end 204 and opposing end 206. The handle 102 may be made of a solid electrically insulative material, such as ceramic, plastic, thermoplastic, or any other suitable material. In other implementations, the handle 102 may made of any material overlayed with rubber, silicon, or any other suitable electrically insulative material. The length, shape, and dimensions of the elongated member 202 may vary depending on the application of use and the dimensions of the wand 110.

The handle 102 may comprise an array of grooves 208 extending longitudinally extending along the length of the elongated member 202 to form a gripping surface 210 for the user to grip and handle the device 100. The gripping surface 210 also provides means for the user to apply torque through the device 100 to bend electrical wiring.

The handle may further include a cylindrical collar 212 coupled to or integrally formed with the first end 204. The collar 212 may include circular recess 214 for receiving a tapered end of the wand 110, as discussed in further detail below.

The wand 110 may comprise a solid elongated cylindrical shaft 220 having a distal end 222 and a tapered end 224. The distal end 222 of the wand 110 may be coupled to or integrally formed with the cradle 120. In some implementations, the wand 110 may comprise an annular member defining a duct for housing various components of a transistor circuit, as discussed in further detail below. The wand 110 may be constructed to various lengths and diametrical dimensions depending on the application of use and wire gauge of the wiring managed by the device 100.

The tapered end 224 of the wand 110 may be detachably coupled to the collar 212. In particular, tapered end 224 of the wand 110 may be configured to fit within the circular recess 214. In some implementations, the collar 212 may include a rotating quick lock-and-release mechanism 216 to secure the tapered end 224 in and release the tapered end 224 from the recess 214. In other implementations, the tapered end 224 may be secured to the collar by other screws, bonding, glue, interference fit, or other mechanical means. In further implementations, the wand 110 may be integrally formed with the collar 212.

The cradle 120 includes a body 230 that couples a first prong 232 and a second prong 234 to each other so as to form a substantially U-shape. The body 230 may further be defined by opposing flat planar surfaces 238 and contoured peripheral surfaces 240.

The body 230 and the first and second prongs 232 and 234 define a yoke 236 for receiving electrical wiring therethrough. The yoke 236 is configured to engage and bend electrical wiring in a wiring harness or electrical box. The yoke 236 has a width (i.e., spacing between the first prong 232 and the second prong 234) that may vary depending on the wire gauge of the wiring managed by the device 100. In addition, the length and diametrical dimensions of the first and second prongs 232 and 234 may vary depending on the wire gauge of the wiring managed by the device 100 as well as the desired bend radius of the wiring.

The device 100 enables users to engage and bend wiring in a wiring harness or electrical box without physically contacting the wiring directly. This prevents users from accidentally touching live wires during assembly and maintenance. The device 100 is useful for assembling and servicing wiring with tight clearances.

Figure 3:
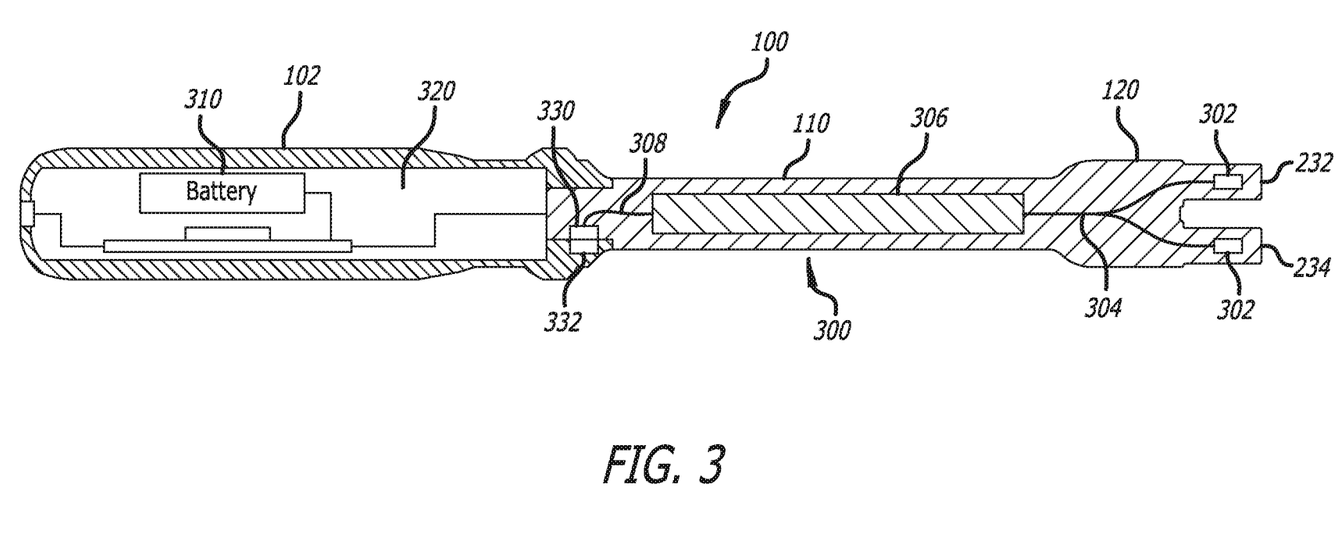
FIG. 3 is a cross-sectional view of the electrical wire management device of FIG. 1.

FIG. 3 is a cross-section view of the electrical wire management device 100. As shown, the device 100 comprises a transistor circuit 300.

The transistor circuit 300 may include induction sensors 302 disposed in the first and second prongs 234 and 236 of the cradle 120. The induction sensors 302 may be electrically coupled by wiring 304 to transistor circuitry 224 housed in the wand 110. In some implementations, the induction sensors 302 may be electrically coupled to transistor circuitry 224 in parallel or series. The various components of a transistor circuitry are well-known in the art and will not be discussed in detail herein for simplicity.

A battery 310 may be electrically coupled via wiring 308 to the components of the transistor circuit 300 to provide electrical power to the components. The battery 310 may be a lithium-ion battery, nickel-cadmium battery, rechargeable battery, or any other suitable source. The battery 310 may be housed in a cell 320 formed in the handle 106 interior.

As further shown in FIG. 3, in implementations where the wand 110 is detachably coupled to the handle 102, the wand 110 may include a male electrical connector 330 coupled the tapered end 224, and an electrical contact 332 coupled to the collar 212 of the handle 102. Preferably, the male electrical connector 330 may comprise a spring-loaded male electrical contact connector or any other suitable connector. Preferably, the electrical contact 332 may comprise a thin-planar metal plate or any other suitable contact.

In such implementations, the male electrical connector 330 may be electrically coupled to the transistor circuitry 306, and the electrical contact 332 may be electrically coupled to the battery 310. When the tapered end 224 of the wand 110 engages the circular recess 214 of the collar 212, the male electrical connector 330 is configured to mate with the electrical contact 332 to provide an electrical connection between the transistor circuitry 306 and the battery 310. When the tapered end 224 of the wand 110 is detached from the circular recess 214 of the collar 212, the male electrical connector 330 disengages from the electrical contact 332 to disconnect the electrical connection between the transistor circuitry 306 and the battery 310.

Figure 4A:
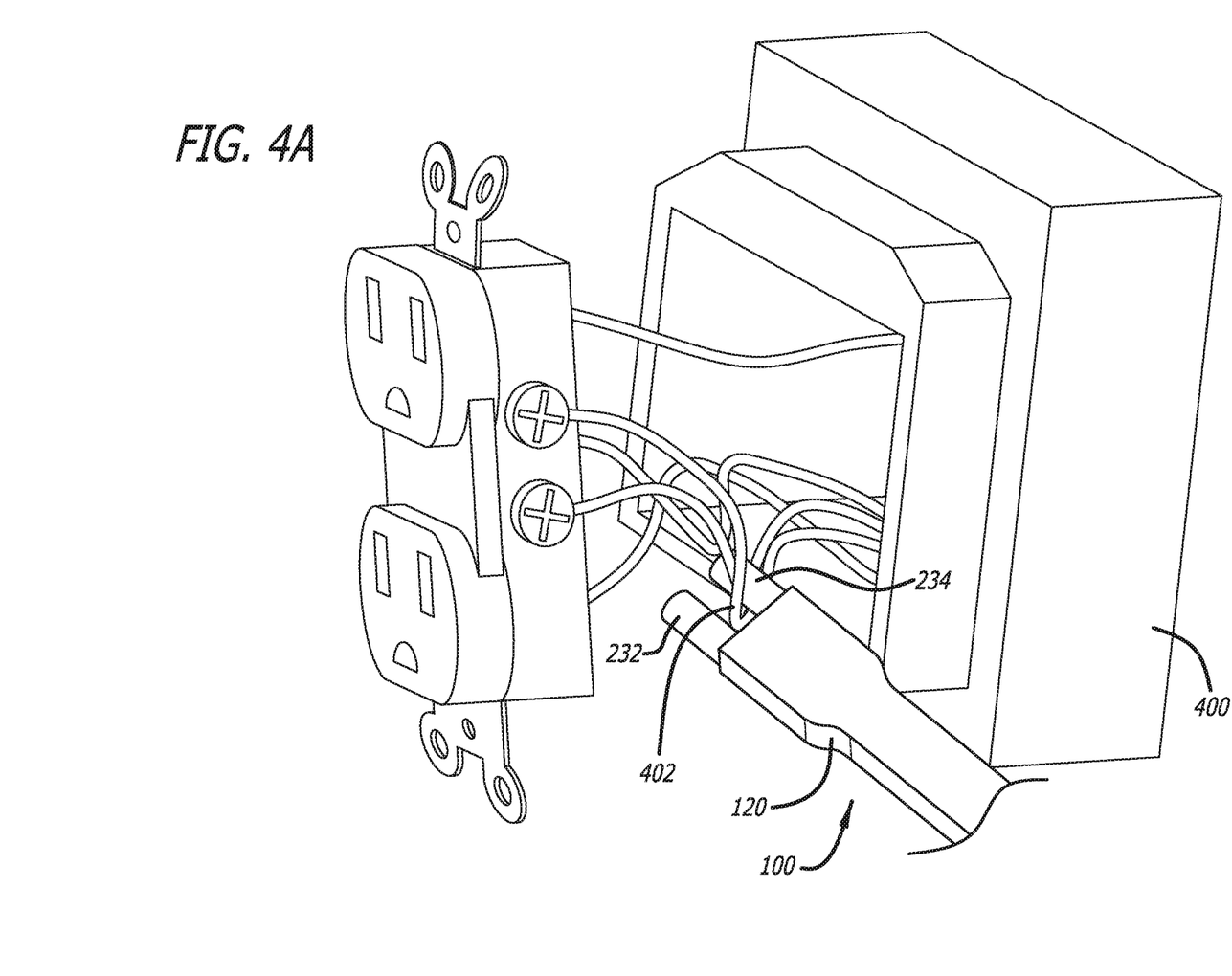
FIG. 4A is a partial perspective view of the electrical wire management device of FIG. 1 being applied to electrical wiring in an electrical box.
Figures 4B, 4C:
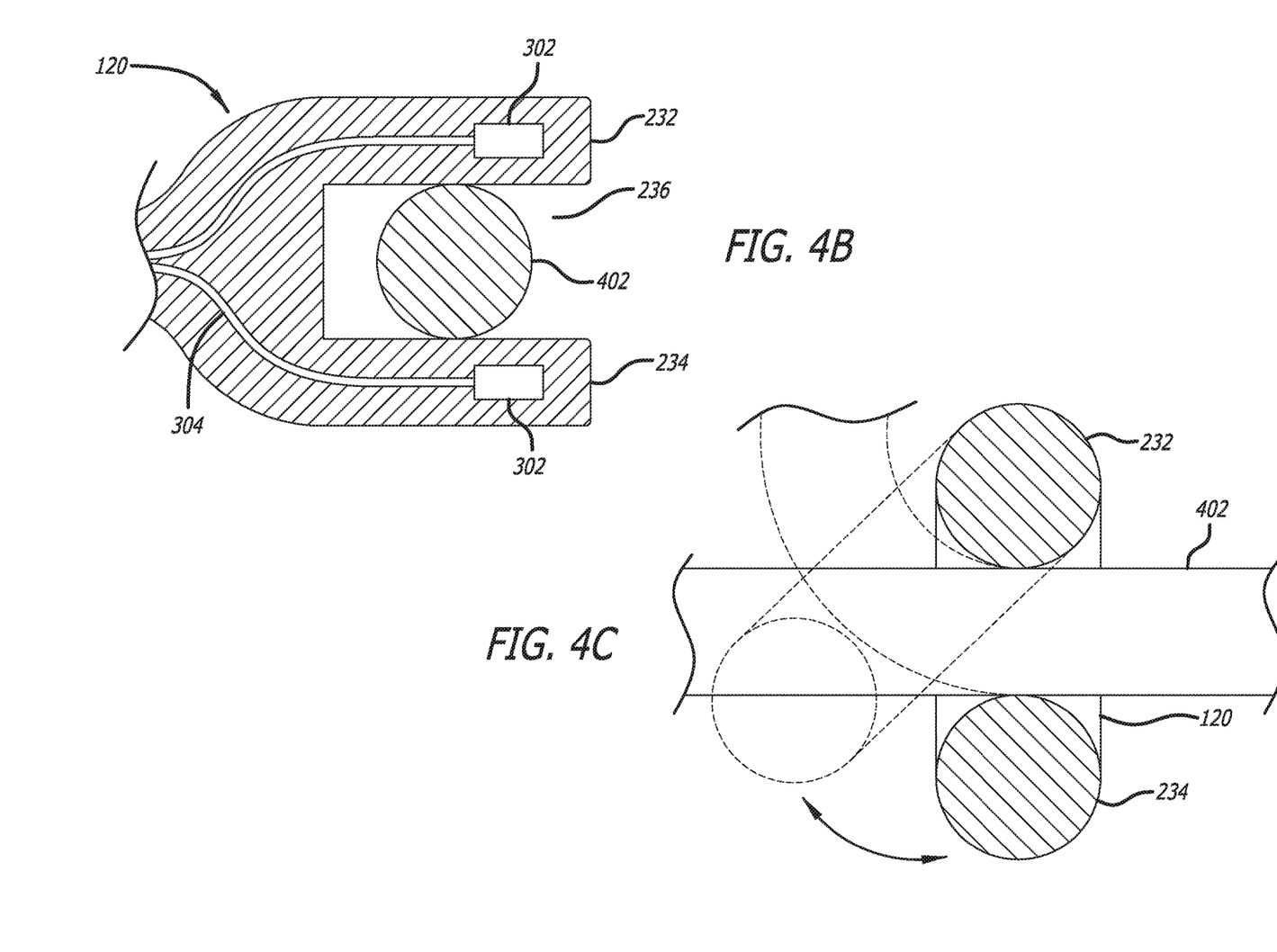
FIG. 4B is a partial cross-sectional of the electrical wire management device depicted in FIG. 4A.
FIG. 4C is a partial cross-sectional of the electrical wire management device depicted in FIG. 4A.

FIG. 4A-C illustrate how the electrical wire management device 100 may be applied. More specifically, FIG. 4A illustrates how device 100 may be used to manage wiring 402 in an electrical box 400. In most instances, electrical technicians have limited space to bend electrical wiring in an electrical box professionally and set them in a switch gear, breakers, other any type of connections or terminals. Because these applications are restricted by access, this may cause the technicians to cut their hands or knuckles or other complications. These complications cause technicians to get frustrated and compromise the quality of installment just to get the job done. The device 100 of the present disclosure provides a tool that provides better access to the electrical wiring for safer and more effective handling and installation.

As better shown in FIG. 4B, the cradle 120 is configured such that the first and second prongs 232 and 234 engage or "cradle" the electrical wiring 402. The cradle 120 may be used to handle, assemble and bend electrical wiring in the electrical box 400. As discussed above, the yoke 236 width may vary depending on the wire gauge of the wiring 402 managed by the device 100.

As shown in FIG. 4C, the cradle 120 may be used to bend the wiring 402 to preferred radiuses or other dimensions. As shown, prongs 232 and 234 "cradle" the wiring 402 so the wiring 402 may be handled by the technician and bent or adjusted to a desired arrangement, as illustrated by dashed lines. The yoke 236 is configured to cradle the electrical wiring 402 wherein the user may grip and turn the handle 102 (FIG. 1) clockwise or counterclockwise to bend or otherwise manipulate the electrical wiring 402 extending through the yoke 236.

The wand 110 (FIG. 1) enables the user to reach and access wiring in areas with restricted access. The diametrical dimensions of the first and second prongs 232 and 234 may vary depending on the wire gauge of the wiring 402 managed by the device 200 as well as the desired bend radius of the wiring 402. For example, one device may include a set of prongs 232 and 234 with diametrical dimensions of 0.25 inches, while another may include a set of prongs 232 and 234 with diametrical dimensions of 0.375 inches.

The electrical wire management device 100 of the present disclosure provides better means for handling and manipulating electrical wiring over pliers typically used by electrical technicians because the prongs 232 and 234 of the device 100 provide non-abrasive contouring and resistance with the wiring 402 material as the wiring is handled and manipulated. On the other hand, pliers may kink the wiring and leave abrasions and damage the wires during manipulation and installation. The device 100 also enables the user to bend wiring 402 with more torquing force as well. Thus, the electrical wire management device 100 of the present disclosure increases the safety and quality of wiring installation for the user.

Figure 5:
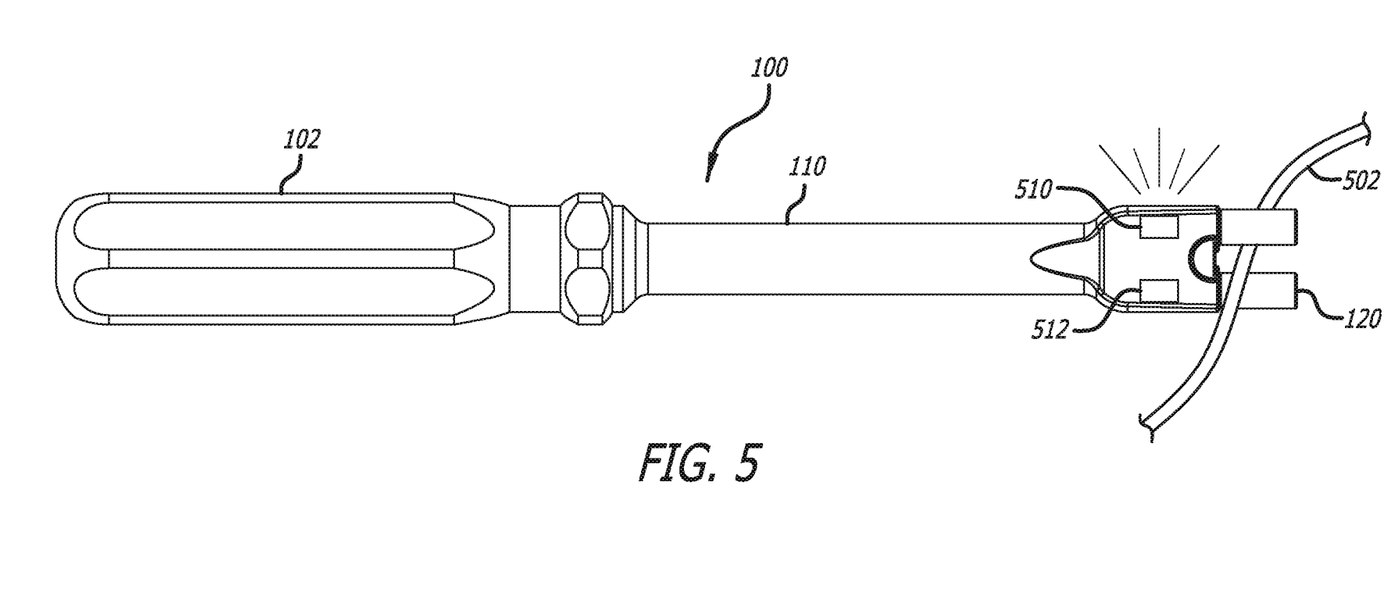
FIG. 5 is a plan view of the electrical wire management device of FIG. 1 placed in close proximity to an electrical wire having a live current.

FIG. 5 is a plan view illustrating the electrical wire management device 100 being placed in proximity to a "hot" or "live" wire 502. In some implementations, the transistor circuit 300 and induction sensors 302 (FIG. 3) of the cradle 120 are configured to detect whether an electrical wire is "hot," meaning that it is presently carrying a live current. The circuit 300 detects whether a wire is "hot" by electromagnetic induction (e.g., detecting an alternating current flowing through an electrical wire) or other suitable means. In some implementations, cradle body 230 may be constructed from a translucent material, such as glass, plexiglass, acrylic, or polycarbonate, and the transistor circuit 300 may be electrically coupled to one or more light-emitting diodes (LED) 510 that are energized to illuminate the cradle body 230 when the circuit 300 detects that the electrical wire 502 is "hot."

In other implementations, the transistor circuit 300 may be electrically coupled to a transducer 512 housed in the cradle body 230 that "chirps" or provides other audio sounds when the circuit detects that the electrical wire 502 is "hot."

It is preferred that the transistor circuit 300 is configured to detect electrical current flowing through an electrical wire when the wand 110 or cradle 120 is placed within a half-inch of the electrical wiring and, more preferably, within a quarter-inch of the electrical wiring carrying the live current. Thus, the device only needs to be brought into close proximity of a "hot" wire, and the wire would not need to be touched by the device 100 in order for wire to be detected. The accuracy of the detection will be based on the quality and sensitivity the induction sensors 230.

In other implementations, the device may further include a micro-vibration motor (not shown) housed in the handle cell 320. The vibration motor may be electrically coupled to the transistor circuit 300 to energize the motor to vibrate the handle 102 when the circuit detects that an electrical wire is "hot."

Figure 6:
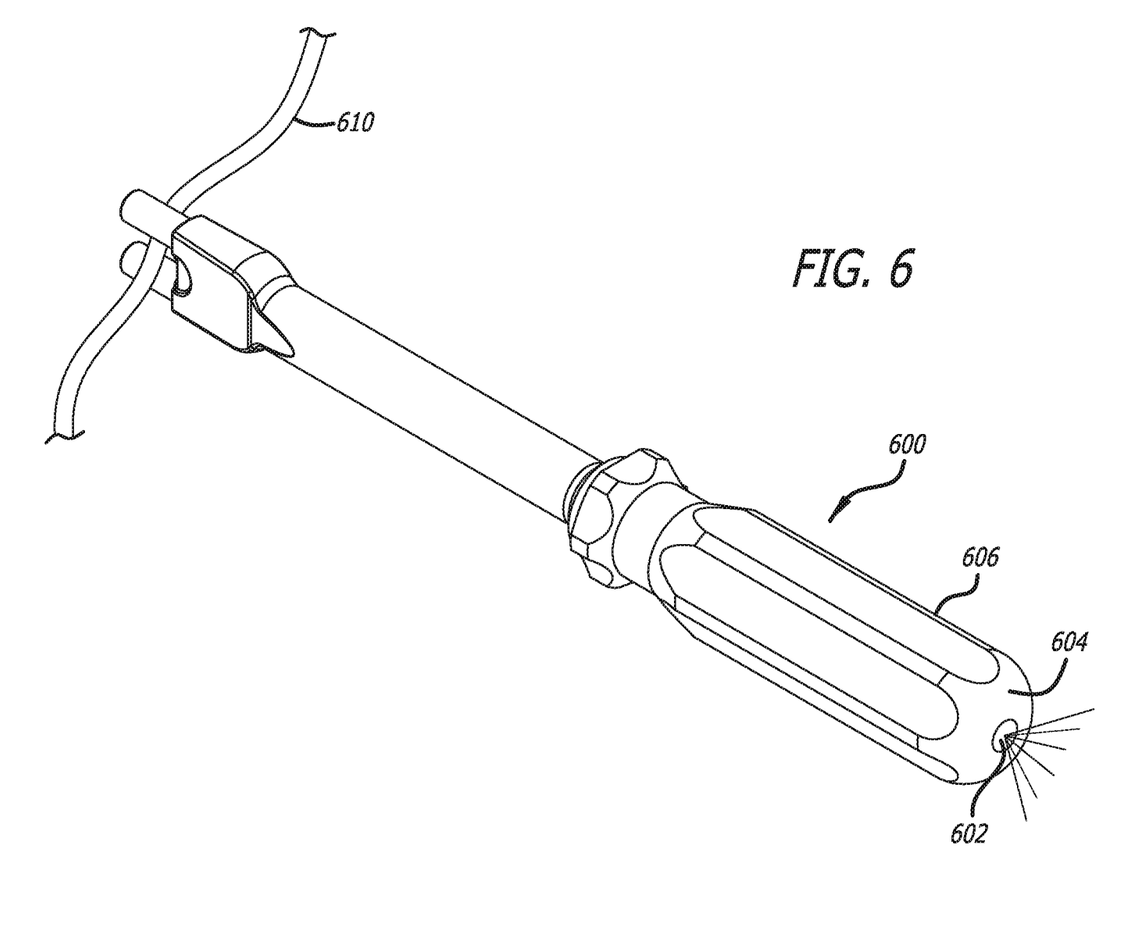
FIG. 6 is a front perspective view illustrating a second example of an electrical wire management device according to the teachings of the present disclosure.

FIG. 6 is a front perspective view of a second example of an electrical wire management device 600 according to the teachings of the present disclosure. In this example, the device 600 may comprise an LED 602 coupled to a proximal end 604 of the device handle 606. According to this implementation, the LED 602 may be electrically coupled to the transistor circuit (not shown) to be energized to illuminate proximal end 604 of the handle 606 when the circuit detects that an electrical wire 610 is "hot."

The device described in the present disclosure enables users to engage and manipulate wiring in an electrical box or wiring harness without physically contacting the wiring directly. The device also indicates to the user when an electrical wire has a living current flowing through it.

The dimensions of the device may vary according to its application. For example, for managing 8 to 14 gauge electrical wiring for lighting circuits, water heaters, and air conditions, the devices may have an overall length of 22 cm long with a cradle width of 0.5 cm. For managing, for example, 2 to 6 gauge electrical wiring for car chargers, commercial and industrial motor power supplies, transformers, and switch cabinets, the devices may have an overall length of 44 cm long with a cradle width of 1.0 cm. For managing, for example, 1 to 3 gauge electrical wiring for residential service entrances, commercial and industrial motor power supplies, transformers, and switch cabinets, the devices may have an overall length of 66 cm long with a cradle width of 1.5 cm.

In general, terms such as "coupled to," and "configured for coupling to," and "secured to," and "configured for securing to" and "in communication with" (for example, a first component is "coupled to" or "is configured for coupling to" or is "configured for securing to" or is "in communication with" a second component) are used herein to indicate a structural, functional, mechanical, electrical, signal, optical, magnetic, electromagnetic, ionic or fluidic relationship between two or more components or elements. As such, the fact that one component is said to be in communication with a second component is not intended to exclude the possibility that additional components may be p resent between, and/or operatively associated or engaged with, the first and second components.

Although the previous description illustrates particular examples of various implementations, the present disclosure is not limited to the foregoing illustrative examples. A person skilled in the art is aware that the disclosure as defined by the appended claims and their equivalents can be applied in various further implementations and modifications. In particular, a combination of the various features of the described implementations is possible, as far as these features are not in contradiction with each other. Accordingly, the foregoing description of implementations has been presented for purposes of illustration and description. Modifications and variations are possible in light of the above description.

What is claimed is:

1. An electrical wire management device, the device comprising:
   a handle;
   a wand coupled to an end of the handle, the wand comprising a cylindrical shaft having a proximal end and a distal end; and
   a cradle coupled to the distal end of the wand, the cradle having a body coupling a first prong and a second prong to each other so as to form a U-shape,
   where the body and the first and second prongs define a yoke for receiving an electrical wire therethrough.

2. The device of claim 1, where the handle comprises an elongated member having a gripping surface.

3. The device of claim 1, where the wand is detachably coupled to the handle by a quick locking-and-release mechanism.

4. The device of claim 1, where the first prong and the second prong each comprise an elongated cylindrical shape.

5. The device of claim 1, where the body of the cradle is defined by opposing planar surfaces.

6. The device of claim 1, where the cradle and the wand are made of non-conductive material.

7. The device of claim 1, where the yoke is configured to cradle the electrical wire wherein the user may grip and turn the handle clockwise or counterclockwise to bend or otherwise manipulate the electrical wire extending through the yoke.

8. An electrical wire management device, the device comprising:
   a handle enclosing a battery;
   a wand coupled to an end of the handle, the wand comprising cylindrical shaft having a proximal end and a distal end, the shaft enclosing a transistor circuit, where the transistor circuit is electrically coupled to the battery; and
   a cradle coupled to the distal end of the shaft, the cradle having a body coupling a first prong and a second prong to each other so as to form a U-shape,
   where the body and the first and second prongs define a yoke for receiving an electrical wire therethrough, and
   where the first prong and second prong include induction sensors electrically coupled to the transistor circuit.

9. The device of claim 8, where the transistor circuit is configured to detect a live current flowing through an electrical wire when the wand is placed in proximity to the electrical wire.

10. The device of claim 9, where the transistor circuit detects a live current flowing through an electrical wire by electromagnetic induction.

11. The device of claim 9, where the cradle houses a light emitting diode electrically coupled to the transistor circuit, wherein when the transistor circuit detects a live electrical current flowing the electrical wire the transistor circuit energizes the light emitting diode to indicate that the electrical wire is hot.

12. The device of claim 9, where the cradle houses a transducer electrically coupled to the transistor circuit, wherein when the transistor circuit detects a live electrical current flowing the electrical wire the transistor circuit energizes the transducer to cause the transducer to emit an audio sound to indicate that the electrical wire is hot.

13. The device of claim 8, where the wand is detachably coupled to the handle by a quick locking-and-release mechanism.

14. The device of claim 8, where the cradle and the wand are made of non-conductive material.

15. The device of claim 8, where the yoke is configured to cradle the electrical wire wherein the user may grip and turn the handle clockwise or counterclockwise to bend or otherwise manipulate the electrical wire extending through the yoke.

* * * * *